(12) United States Patent
Dieny et al.

(10) Patent No.: US 7,821,818 B2
(45) Date of Patent: Oct. 26, 2010

(54) MAGNETORESISTIVE TUNNEL JUNCTION MAGNETIC DEVICE AND ITS APPLICATION TO MRAM

(75) Inventors: Bernard Dieny, Lans en Vercors (FR); Anatoly Vedyaev, Moscow (RU); Jérôme Faure-Vincent, Montfavet (FR); Patrick Warin, Coublevie (FR); Matthieu Jamet, Voiron (FR); Yves Samson, Grenoble (FR)

(73) Assignees: Comissariat a l'Energie Atomique et aux Energies Alternatives, Paris (FR); Centre National de la Recherche Scientifique (CNRS), Paris (FR)

( * ) Notice: Subject to any disclaimer, the term of this patent is extended or adjusted under 35 U.S.C. 154(b) by 0 days.

(21) Appl. No.: 12/083,398

(22) PCT Filed: Oct. 13, 2006

(86) PCT No.: PCT/EP2006/067374

§ 371 (c)(1),
(2), (4) Date: Nov. 12, 2008

(87) PCT Pub. No.: WO2007/042563

PCT Pub. Date: Apr. 19, 2007

(65) Prior Publication Data

US 2009/0231909 A1    Sep. 17, 2009

(30) Foreign Application Priority Data

Oct. 14, 2005 (FR) .................... 05 10533

(51) Int. Cl.
*G11C 11/00* (2006.01)
(52) U.S. Cl. ............... 365/158; 365/171; 365/173; 365/145
(58) Field of Classification Search ................ 365/158, 365/171, 173, 145
See application file for complete search history.

(56) References Cited

U.S. PATENT DOCUMENTS 5,973,334 A    10/1999    Mizushima et al.

(Continued)

FOREIGN PATENT DOCUMENTS

DE    101 23 820 A1    5/2002

(Continued)

OTHER PUBLICATIONS

Tiusan C. et al: Quantum coherent transport versus diode-like effect in semiconductor-free metal/insulator structure,: Applied Physics Letters, AIP, American Institute of Physics, Melville, NY, US, vol. 79, No. 25, Dec. 17, 2001, pp. 4231-4233.

(Continued)

*Primary Examiner*—Connie C Yoha
(74) *Attorney, Agent, or Firm*—Weingarten, Schurgin, Gagnebin & Lebovici LLP

(57) ABSTRACT

The magnetic device comprises a magnetic device comprising a magnetoresistive tunnel junction (100), itself comprising: a reference magnetic layer (120) having magnetization in a direction that is fixed; a storage magnetic layer (110) having magnetization in a direction that is variable; and an intermediate layer (130) acting as a tunnel barrier that is essentially semiconductor or electrically insulating and that separates the reference magnetic layer (120) from the storage magnetic layer (110). The potential profile of the intermediate layer (130) is asymmetrical across the thickness of said layer (130) so as to produce a current response that is asymmetrical as a function of the applied voltage. The device is applicable to magnetic random access memories.

24 Claims, 8 Drawing Sheets

U.S. PATENT DOCUMENTS

| | | | |
|---|---|---|---|
| 6,747,335 B1 * | 6/2004 | Bloomquist | 257/537 |
| 6,921,954 B2 * | 7/2005 | Sharma | 257/421 |
| 6,956,766 B2 * | 10/2005 | Nakamura et al. | 365/171 |
| 6,982,901 B1 * | 1/2006 | Bloomquist et al. | 365/158 |
| 7,372,727 B2 * | 5/2008 | Nakamura et al. | 365/171 |
| 2002/0105823 A1 | 8/2002 | Redon et al. | |
| 2002/0114112 A1 | 8/2002 | Nakashio et al. | |
| 2003/0142562 A1 | 7/2003 | Kreupl | |
| 2005/0002228 A1 | 1/2005 | Dieny et al. | |
| 2005/0083760 A1 | 4/2005 | Subramanian et al. | |
| 2005/0094436 A1 | 5/2005 | Hayakawa | |
| 2005/0158881 A1 * | 7/2005 | Sharma | 438/3 |

FOREIGN PATENT DOCUMENTS

| | | |
|---|---|---|
| WO | WO 00/70689 | 11/2000 |
| WO | WO 03/043017 | 5/2003 |

OTHER PUBLICATIONS

Brückl H. et al: "Evolution of barrier asymmetry in magnetic tunnel junctions," Applied Physics Letters, AIP, American Institute of Physics, Melville, NY, US, vol. 78, No. 8, Feb. 19, 2001, pp. 1113-1115.

* cited by examiner

MAGNETORESISTIVE TUNNEL JUNCTION MAGNETIC DEVICE AND ITS APPLICATION TO MRAM

This application is a §371 national phase filing of PCT/EP2006/067374 filed Oct. 13, 2006, and claims priority to French application No. 05 10533 filed Oct. 14, 2005.

The present invention relates to a magnetoresistive tunnel junction magnetic device and to its application to magnetic random access memory (MRAM).

Random access or read/write magnetic memory combines the advantages of various types of existing semiconductor memory, namely:

dynamic random access memory (DRAM) that is comparatively dense and fast but volatile, i.e. does not conserve stored information on being switched off;

static random access memory (SRAM) that is comparatively very fast, but occupies a large amount of space and is also volatile; and FLASH memory that is non-volatile and comparatively dense, but very slow to write.

MRAM first seeks to constitute a universal memory suitable for use for example in computers where the advantage of non-volatility can be of use, making it possible, when switching off the computer, to avoid any need to proceed with systemic backing up of software and data onto hard disk.

Nevertheless, it is still necessary to make progress in the provision of MRAM in order to satisfy requirements that are increasing in terms of information storage, in terms of speed, in terms of density, and in terms of cost per bit.

FIG. 1 is a diagram of an individual MRAM cell. Such an individual cell comprises a magnetoresistive tunnel junction 2 made up of two magnetic layers 3a and 3c spaced apart by an intermediate layer 3b. The magnetic layers comprise a storage layer 3a and a reference layer 3c. The intermediate layer 3b is generally a layer of an oxide constituting the tunnel barrier.

Information is stored in the form of the direction of magnetization of the storage layer 3a, the memory cell presenting lower electrical resistance when the reference layer 3c and the storage layer 3a are magnetized in parallel, and higher electrical resistance when the magnetization in the two layers is antiparallel.

MRAM is generally implemented in a matrix configuration, where each individual cell 2 is at the intersection of at least two conductor lines comprising a conductor line 6 referred to as the "bit" line, and a conductor line 8 referred to as the "word" line. It is possible to address the individual memory cell using one bit line 6 and one word line 8 in order to read its information (see FIG. 1).

The configuration shown in FIG. 1 provides numerous advantages. Nevertheless, it is necessary to ensure that current does not follow any of the numerous alternative paths going through cells adjacent to the cell selected at the intersection of the selected word line and bit line.

To remedy that problem, proposals have already been made to insert a diode 1 in series with each memory cell 2 (see FIGS. 2 and 3).

FIG. 2 shows an example of reading a cell 2a of that type. The arrows identify the bit line 6 and the word line 8 along which a current travels, thereby addressing the cell 2a that is to be read.

FIG. 3 shows an example of writing a "1" in a cell 2b of that type, and of writing a "0" in another cell 2c of the same type. In the example of FIG. 3, the two cells 2a and 2b lie on the same word line 8 and correspond to two different bit lines 6. In FIG. 3, the arrows represent the directions of current flow in the bit and word lines. It can be seen that the current flow directions are different in the bit lines 6 for writing a "1" in the cell 2b and for writing a "0" in the cell 2c.

FIGS. 4 and 5 show another prior art embodiment for remedying the above-mentioned problem of current flowing along numerous alternative paths.

In the prior art embodiment of FIGS. 4 and 5, a transistor 4 is inserted in series with each memory cell 2. An embodiment of that type is described by way of example in patent document WO 03/043017 A2.

The junction 2 is thus placed between a switch transistor 4 and a current feed line 6 forming a top conductor line or bit line. A current I1 traveling therealong and represented by an arrow produces a first magnetic field 7, likewise represented by an arrow. A conductor 8 forming a bottom line or word line orthogonal to the current feed line 6 serves to produce a second magnetic field 9 by causing a current I2 to flow therealong. The current I2 and the magnetic field 9 are likewise represented by arrows.

In "write" mode (FIG. 4), the transistor 4 is placed in blocked mode and no current flows through the transistor. Current pulses are caused to flow in the current feed line 6 and in the conductor 8. The junction 2 is thus subjected to two orthogonal magnetic fields. One of them is applied along the difficult magnetization axis of the free layer 3a in order to reduce its reversal field, while the other field is applied along its easy axis in order to reverse its magnetization and thus write the memory point.

In principle, only the memory point located at the intersection of the two lines 6 and 8 is liable to reverse, since each magnetic field when taken individually is not large enough to cause the magnetization to change over.

In "read" (FIG. 5), the transistor 4 is placed under saturated conditions (i.e. the current flowing through the transistor is at a maximum) by sending a positive current pulse of suitable amplitude to the grid of the transistor. The current I3 sent into the line 6 and likewise represented by an arrow flows solely through the memory point having its transistor placed in saturated mode.

This current I3 serves to measure the resistance of the junction at this memory point. By comparison with a reference memory point the state ("0" or "1") of the memory point can thus be determined: it is then known whether the storage layer 3a is magnetized parallel or antiparallel to the magnetization of the reference layer 3c.

The above-described solutions present the drawback of a certain amount of technological complexity because of the need to integrate CMOS technology (for making diodes or transistors) and magnetic technology (for the individual memory cells).

Furthermore, those structures do not make it easy to integrate a plurality of levels of MRAM in order to build up a three-dimensional memory structure.

Including a transistor (which itself requires three electrical connections) beside each magnetic memory cell constitutes a limiting factor because of the area required, thereby preventing very high densities being reached.

Another solution has also been proposed that relies on inserting a double tunnel junction referred to as metal-insulation-metal-insulation-metal or MIMIM in series with the magnetic tunnel junction in an attempt to integrate a diode function within the magnetic element itself rather than implementing the diode function by using CMOS technology.

Such work is inspired by the article by Tiusan et al., published in Appl. Phys. Lett. 79, 4231 (2001) in which it is demonstrated that in a variety of configurations such double tunnel junctions can present an electrical response that is highly asymmetrical with respect to the sign of the applied voltage, the response being comparable to that of a diode. The double tunnel junction element and elements that operate in similar manner are thus referred to as tunnel diodes.

Unlike the two solutions described further above, that solution has the advantage of not associating semiconductors, metals, and oxides, thus making it easier to implement. By avoiding inserting components having three electrical junctions, such as transistors, it also makes it possible to achieve higher-density integration by reducing the area occupied by each individual memory cell. That solution is described in certain configurations in patent document US 2005/0083760 A1.

A variant of the preceding solution consists in making a tunnel barrier constituted by two different materials, i.e. a metal-insulation 1-insulation 2-metal structure that can also present the desired asymmetry (diode function).

Nevertheless, the stack integrating the tunnel junction remains very complex (having two or three tunnel junctions in series). Furthermore, the voltage of the intermediate layer between the MIMIM diode and the magnetic tunnel junction is floating and difficult to control because of the non-linear response of the set of junctions to applied voltage.

Finally, the electrical resistivity of a plurality of tunnel junctions connected in series is necessarily high, thereby limiting the current that can be used and making it more difficult to implement particular technical solutions, such as, for example:

thermally-assisted writing in which the free magnetic layer of the addressed tunnel junction is heated, advantageously by an electric current injected through the tunnel junction, so as to reduce its coercive field (the magnetic field that enables the magnetization to be reversed). That solution and its advantages are described in patent document US 2005/0002228 A1; and writing by injecting polarized current, where spin-polarized current is injected from a ferromagnetic electrode, which may be the reference layer, towards the storage layer, so as to assist in or give rise to reversal of its magnetization. That solution and its advantages are also described in patent document US 2005/0002228 A1.

An object of the present invention is to remedy the above-specified drawbacks, in particular to avoid the drawbacks of implementing transistors, diodes, or tunnel diodes in association with individual memory cells of the magnetic type.

Another object of the invention is to provide a configuration for a magnetic device that presents the best possible potential in terms of reducing memory cell size and enabling such a memory cell to be implemented easily in two-dimensional or three-dimensional architectures.

These objects are achieved by a magnetic device comprising a magnetoresistive tunnel junction, itself comprising:

a reference magnetic layer having magnetization in a direction that is fixed;

a storage magnetic layer having magnetization in a direction that is variable; and an intermediate layer acting as a tunnel barrier that is essentially semiconductor or electrically insulating and that separates the reference magnetic layer from the storage magnetic layer;

the device being characterized in that the potential profile of the intermediate layer is asymmetrical across the thickness of said layer so as to produce a current response that is asymmetrical as a function of the applied voltage.

It should be observed that the device of the invention is constituted by mutually parallel layers defining planes. The term "thickness of the intermediate layer" thus designates the linear dimension that is perpendicular to those planes.

In a first possible embodiment, the intermediate layer acting as a tunnel barrier includes in its thickness, at a first distance from the storage magnetic layer and at a second distance from the reference magnetic layer, a very thin layer of a metallic or semiconductive material other than the material(s) constituting the remainder of the intermediate layer so as to create a potential well that is localized and asymmetrical within the tunnel barrier.

The very thin layer may present a thickness of one to two planes of atoms, or even a thickness that constitutes a fraction of a plane of atoms.

The second distance may present a value that is different from that of the first distance.

According to a particular characteristic, the remainder of the intermediate layer comprises different insulating or semiconductive materials on either side of the very thin layer.

By way of example, the intermediate layer may comprise alumina.

Under such circumstances, and advantageously, the very thin layer may be made of a material selected from aluminum, gold, silver, silicon, and germanium.

The intermediate layer may also comprise magnesium oxide.

Under such circumstances, and for example, the very thin layer may be made out of a material selected from chromium, ruthenium, tantalum, gold, silver, silicon, and germanium.

In another possible embodiment, said intermediate layer acting as a tunnel barrier includes a doped region within its thickness at a first distance from the storage magnetic layer and at a second distance from the reference magnetic layer, where the second distance presents a value different from that of the first distance, the doped region being doped by inserting a material other than that constituting the remainder of the intermediate layer so as to create in the doped region a potential well that is localized and asymmetrical within the tunnel barrier.

Under such circumstances, in a particular embodiment, one of the first and second distances is zero, such that the doped region is in contact with one of the two outer interfaces of said intermediate layer with the reference magnetic layer and with the storage magnetic layer.

By way of example, the intermediate layer acting as the tunnel barrier presents a thickness lying in the range 2 nanometers (nm) to 3 nm, and the doped region presents a thickness lying in the range 0.5 nm to 1 nm.

Advantageously, the intermediate layer is made of alumina or of magnesium oxide, and the doped region comprises metallic or semiconductor doping elements comprising at least one of the materials constituted by aluminum, gold, silver, chromium, ruthenium, tantalum, and silicon.

In yet another possible embodiment, said intermediate layer acting as a tunnel barrier comprises a stack of at least a first layer of a first insulating or semiconductive material and presenting a first thickness, and of at least one second layer of a second insulating or semiconductive material different from said first material and presenting a second thickness.

Under such circumstances, in a particular embodiment, the second thickness may present a value that is different from that of the first thickness.

According to an advantageous characteristic, the intermediate layer serving as a tunnel barrier presents thickness lying in the range 1 nm to 3 nm.

The invention also provides a memory comprising an array of memory cells addressable by a set of bit lines and of word lines, said memory being characterized in that each memory cell comprises a magnetic device of the above type, and in that each magnetic device is connected to one bit line and to one word line without interposing any additional switch element.

The memory of the invention may comprise N*N memory cells distributed in a two-dimensional architecture, where N is an integer, each bit line serving N memory cells, and each word line serving N memory cells.

In another embodiment, the memory presents three-dimensional architecture comprising a set of P superposed layers, each of N*N memory cells, each connected to one bit line and to one word line, where P and N are integers, and each bit line and each word line serving memory cells other than the memory cells of the outer layers is associated with memory cells belonging to two different adjacent layers.

In yet another embodiment, the memory presents three-dimensional architecture comprising a stack of P superposed layers of N*N memory cells, memory cells of each layer being distributed in a two-dimensional architecture, P and N being integers, each bit line serving N memory cells and each word line serving N memory cells within one two-dimensional architecture layer, and an insulating separator layer is interposed between two successive two-dimensional architecture layers in periodic manner in the stack of P superposed layers.

Other characteristics and advantages of the invention appear from the following description of particular embodiments, given as examples, and with reference to the accompanying drawings, in which.

A magnetic device of the invention comprises a magnetoresistive tunnel junction 100 (FIGS. 6, 8 and 10 to 12) essentially comprising a reference magnetic layer 120 magnetized in a fixed direction, and a storage magnetic layer 110 presenting magnetization that is variable in direction, with an intermediate layer 130 serving as a tunnel barrier that is essentially semiconductive or electrically insulating and that separates the reference magnetic layer 120 from the storage magnetic layer 120.

According to the invention, the intermediate layer 130 acting as a tunnel barrier presents asymmetry in the potential profile across the thickness of said layer 130 so as to produce a current response that is asymmetrical relative to the direction in which voltage is applied.

In this way, the memory cell addressed at the intersection of the selected word line and bit line is itself selected by virtue of the great reduction in undesirable currents flowing through other memory cells.

The asymmetrical response of current to voltage can be obtained using various embodiments, that can be combined with one another, and that are all characterized by obtaining a potential profile that is asymmetrical across the thickness of the intermediate layer 130 that acts as a tunnel barrier, which intermediate layer 130 can itself be made up of a set of layers.

In a first possible embodiment, the asymmetry of the potential profile across the thickness of this intermediate layer 130 is obtained by inserting a very thin layer within the intermediate layer 130 that acts as the tunnel barrier, which very thin layer is made of a metallic or semiconductive material other than the material(s) constituting the remainder of the intermediate layer, this insertion being performed in such a manner as to create a localized potential well within the tunnel barrier that occupies a point or that is quasi-two-dimensional.

Figure 1:
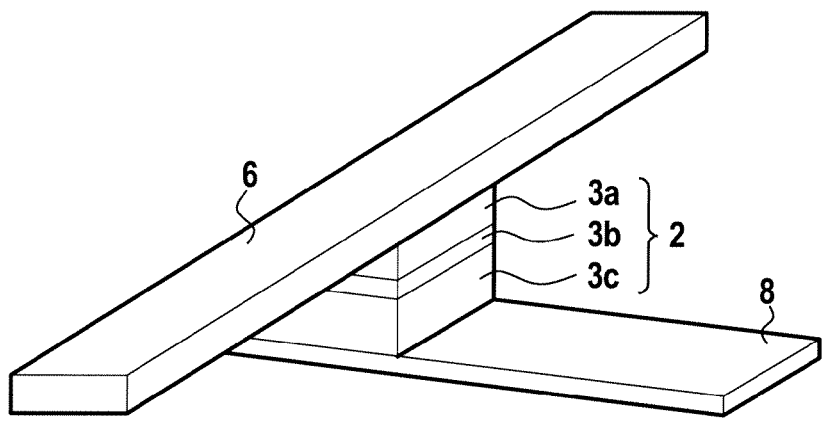
FIG. 1 is a diagrammatic view of a single prior art memory cell of an MRAM.
Figure 2:
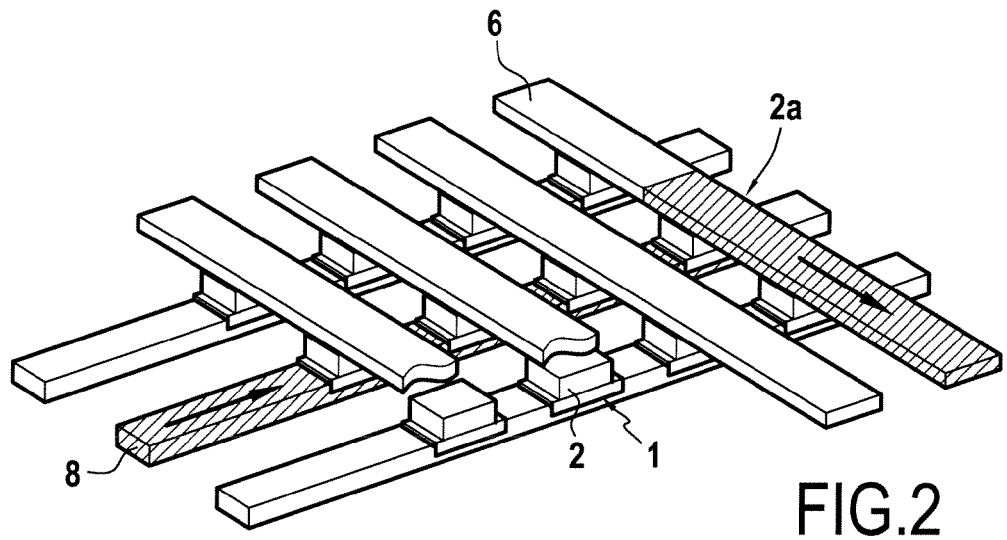
FIGS. 2 and 3 are diagrams showing the read and write functions respectively of a prior art magnetic tunnel junction associated with a diode.
Figure 3:
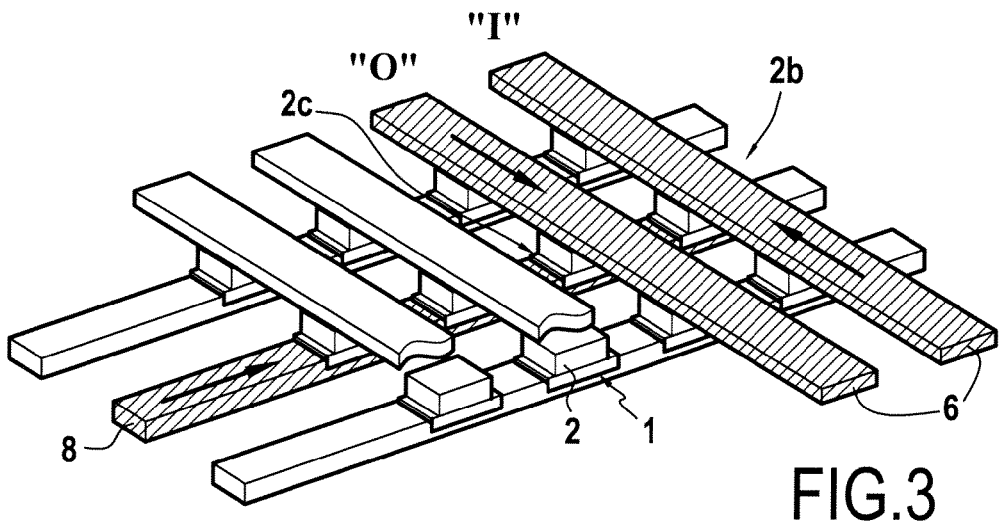
Figure 4:
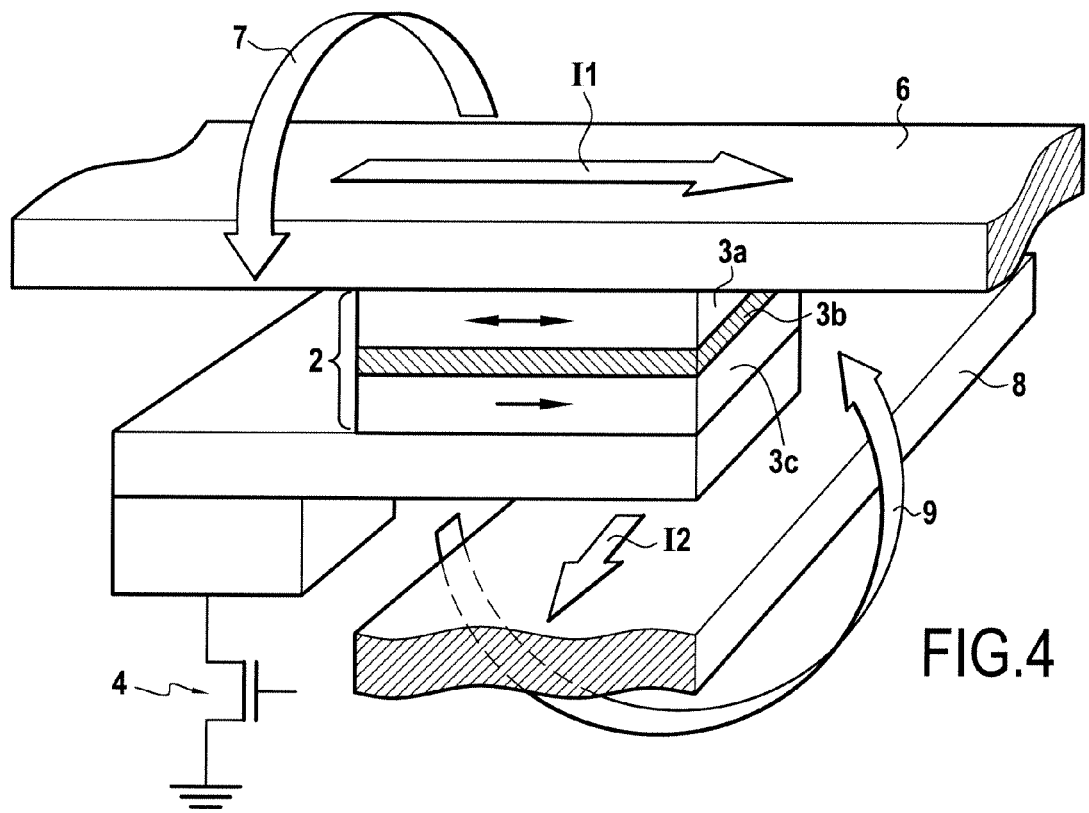
FIGS. 4 and 5 are diagrams respectively showing the read and write functions of a prior art magnetic tunnel junction associated with a transistor.
Figure 5:
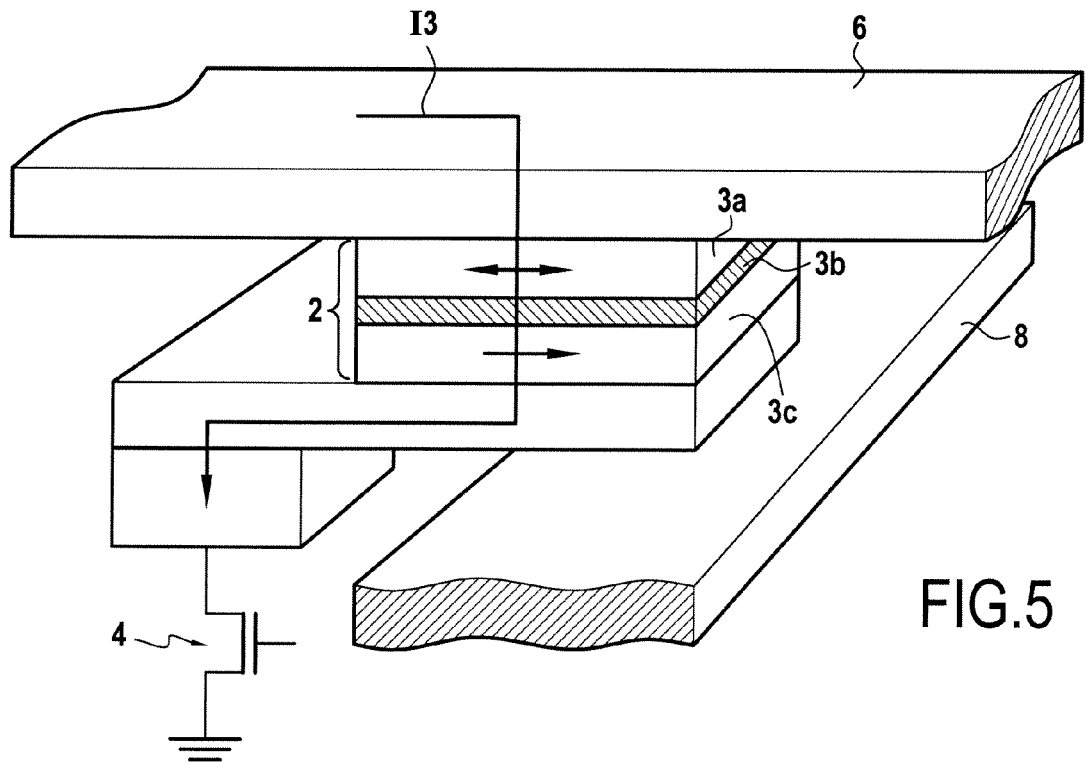
Figure 6:
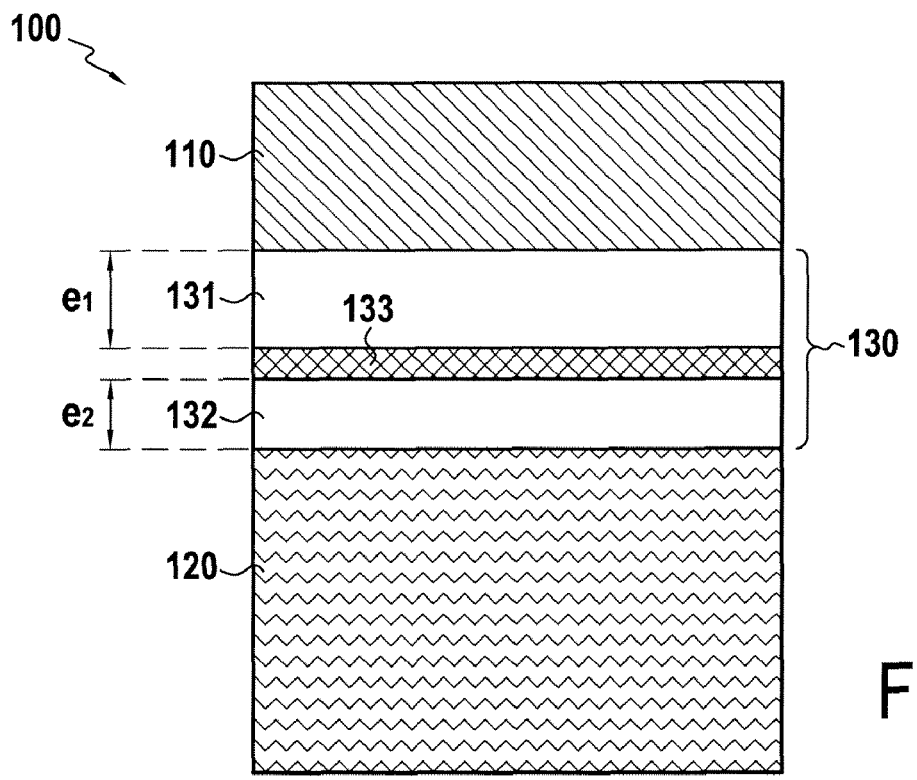
FIGS. 6 and 7 are diagrammatic section views of two variant embodiments of a first example of a tunnel junction memory cell of the invention.
Figure 7:
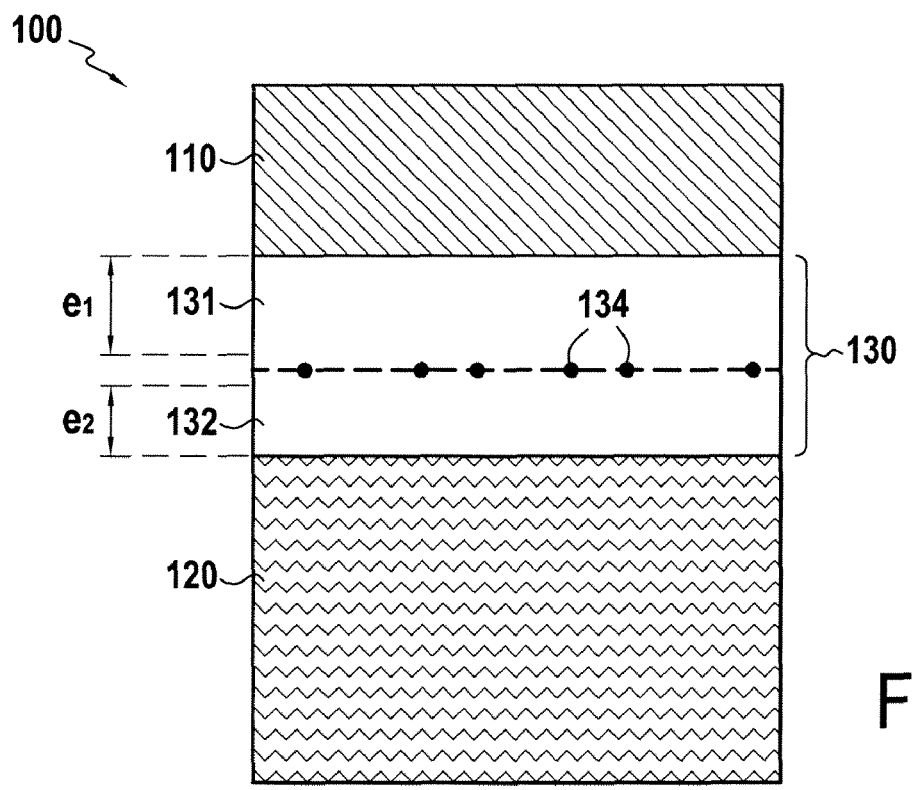

This very thin layer may, for example, constitute one to two planes of atoms of said other material (layer 133 in FIG. 6) or indeed a fraction, even a small fraction, of a plane of atoms of said other material (layer 134 in FIG. 7).

The very thin insert-forming layer 133, 134 is preferably positioned asymmetrically in the thickness of the intermediate layer 130, i.e. within said intermediate layer 130, in such a manner that the very thin layer 133, 134 is closer to one of the two outside interfaces of said intermediate layer 130. Thus, by way of example, FIGS. 6 and 7 show that the thickness $e_1$ of the portion 131 of the intermediate layer 130 situated between the very thin layer 133, 134 and the storage magnetic layer 110 is greater than the thickness $e_2$ of the portion 132 of the intermediate layer 130 situated between the very thin layer 133, 134 and the reference magnetic layer 120.

Figure 8:
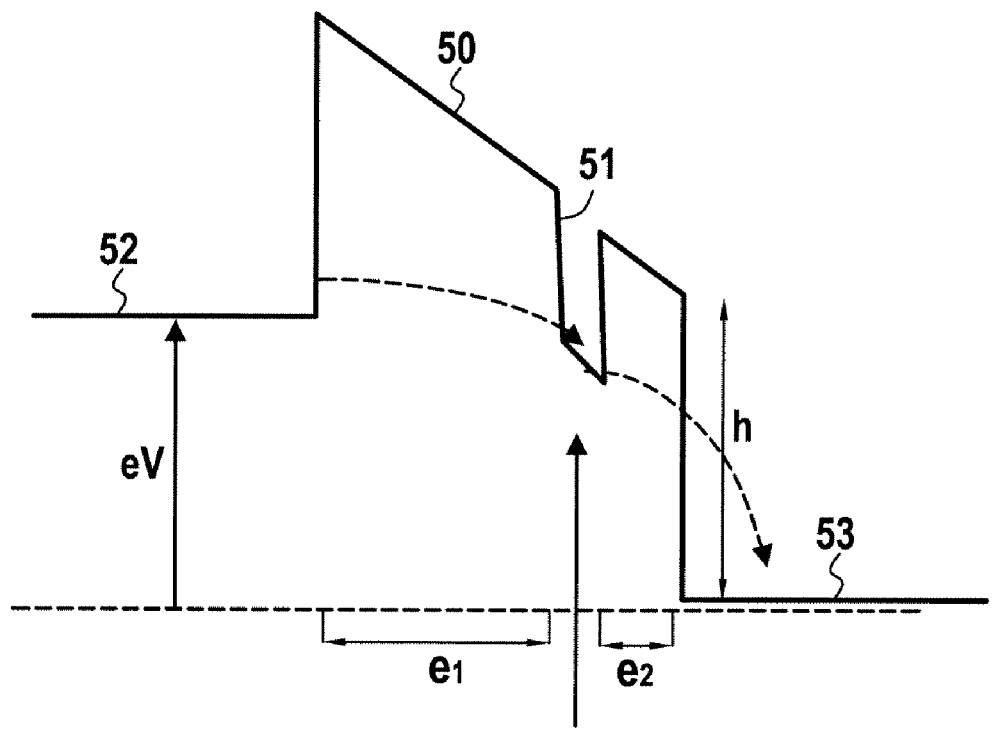
FIGS. 8 and 9 are diagrams showing the potential seen by electrons within the intermediate layer of the tunnel junction of FIG. 6 or of FIG. 7, as a function of the direction of the applied voltage.
Figure 9:
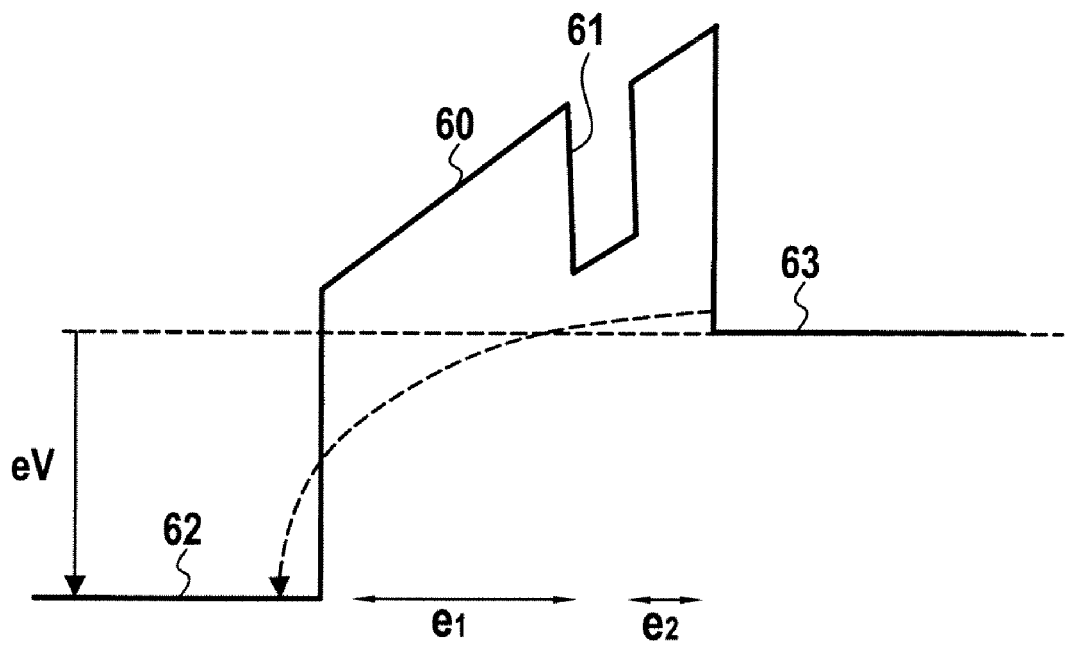

FIGS. 8 and 9 are diagrams showing the energy seen by electrons on passing through the intermediate layer 130 as a function of the direction of the voltage applied to the terminals of said intermediate layer 130.

When a positive voltage V is applied between the storage layer (level 52) and the reference layer (level 53), the potential 50 seen by the electrons presents a potential well 51 at the insert 133, 134 situated in the intermediate layer 130 at distances $e_1$ and $e_2$ from the interfaces of the intermediate layer respectively with the storage layer 52 and the reference layer 53. FIG. 8 shows the height h of the tunnel barrier. The potential well 51 associated with the insert 133, 134 enables the width of the barrier as seen by the electrons passing through the intermediate layer 130 effectively to be reduced.

In contrast, when a negative voltage V is applied between the storage layer (level 63) and the reference layer (level 62), the potential 60 seen by the electrons still presents a potential well 61 at the insert 133, 134 situated in the intermediate layer 130, but this potential well 61 has very little effect on the electrons, which leads to lower electrical conductivity.

The portions 131, 132 of the intermediate layer 130 situated on either side of the very thin layer 133, 134 can be made of different insulating or semiconductive materials.

Figure 10:
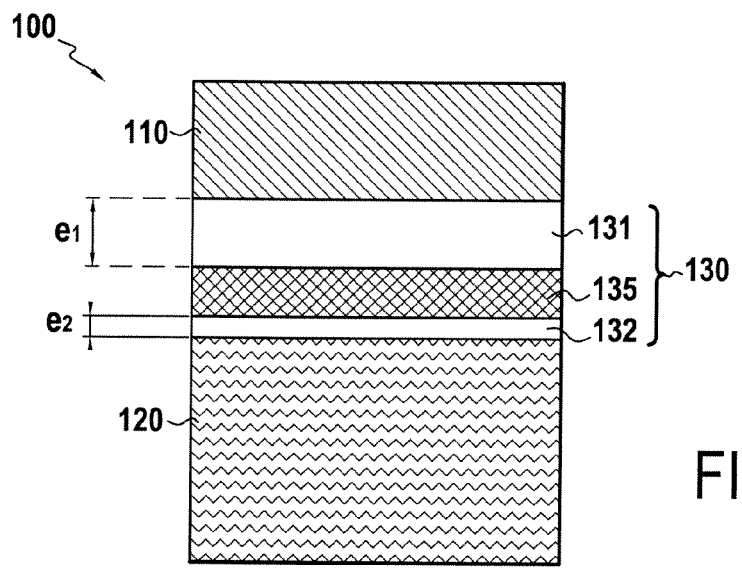
FIGS. 10 and 11 are diagrammatic section views showing two variant embodiments of a second embodiment of a tunnel junction memory cell of the invention.
Figure 11:
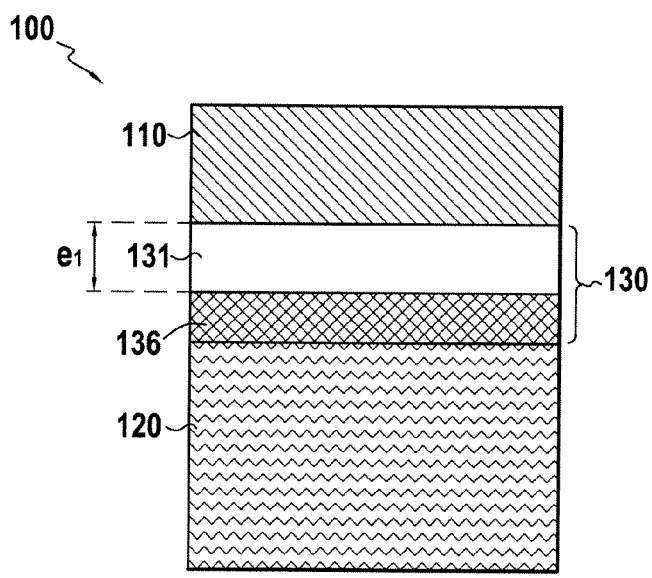

In one possible embodiment, shown in FIGS. 10 and 11, the asymmetry of the potential profile across the thickness of the intermediate layer 130 acting as the tunnel barrier is achieved by creating a doped region within said layer 130 at a distance $e_1$ from the storage magnetic layer 110 and at a distance $e_2$ (different from $e_1$) from the reference magnetic layer 120. The region is doped by inserting a material that is different from that constituting the remainder of the intermediate layer 130, said doping being implemented so as to create within the doped region a potential well that is localized and asymmetrical within the tunnel barrier.

A doped region 135 is thus inserted within the intermediate layer 130 of very low conductivity by inserting a material other than that constituting the other portions 131, 132 of the intermediate layer, leading to a local modification of potential within the doped region (FIG. 10).

The doped region 135 is positioned asymmetrically within the thickness of the intermediate layer 130, i.e. it is not situated at the middle thereof, and it is closer to one of the two outer interfaces of the intermediate layer. In the example of FIG. 10, the doped region 135 is thus closer to the reference magnetic layer 120 than to the storage magnetic layer 110.

One of the distances $e_1$ and $e_2$ could even be zero, such that the doped region is in contact with one of the two outer interfaces of the intermediate layer 130. By way of example, FIG. 11 shows the doped layer 136 positioned directly on the outer interface of the intermediate layer 130 with the reference magnetic layer 120.

Figure 12:
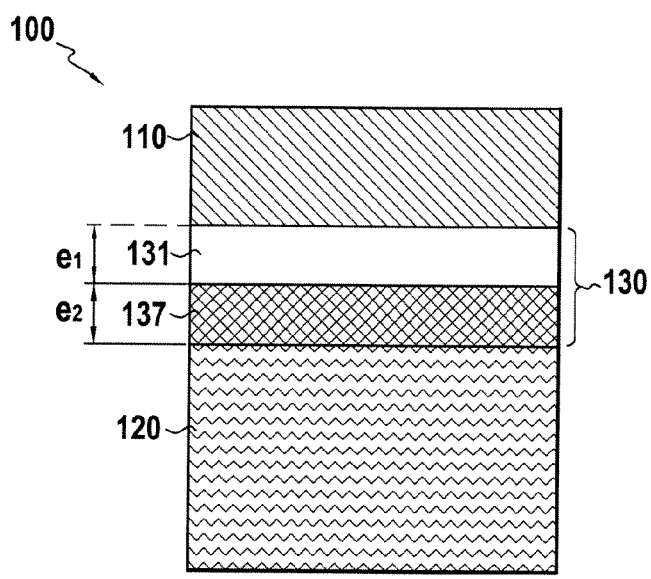
FIG. 12 is a diagrammatic section view of a third example of a tunnel junction memory cell of the invention.

In a third possible embodiment, shown in FIG. 12, the asymmetry of the potential profile across the thickness of the intermediate layer 130 acting as the tunnel barrier is achieved by making up said intermediate layer 130 as a stack of at least one first layer 131 of a first insulating or semiconductive material presenting a thickness $e_1$, and at least one second layer 137 of a second insulating or semiconductive material different from the first material and presenting a thickness $e_2$ that is preferably different from the thickness $e_1$, thereby forming a potential profile within the intermediate layer 130 that is asymmetrical.

A magnetic tunnel junction of the invention can advantageously be made by a deposition process such as cathode sputtering or molecular beam epitaxy.

The storage and reference magnetic layers 110 and 120 can be made using techniques that are now well known to the person skilled in the art. Thus, for example, the reference magnetic layer 120 can be constituted by a stack comprising an antiferromagnetic layer, e.g. of IrMn, and a ferromagnetic layer, e.g. of CoFe alloy when planar magnetization is desired, or an FePt alloy when perpendicular magnetization is desired. By annealing under an external magnetic field to above the temperature constituting the blocking temperature of the antiferromagnetic layer, it is possible to induce an exchange field between the ferromagnetic and antiferromagnetic layers. For planar magnetization, the storage layer 110 is made for example out of FeNi alloy, while for perpendicular magnetization, it is made out of an alloy such as FePt, or in the form of a multilayer platinum/cobalt structure.

The material constituting the intermediate barrier 130 is advantageously selected, for example, from: aluminum oxide (alumina $Al_2O_3$), and magnesium oxide (MgO). The thickness of the intermediate layer 130 is advantageously selected to lie in the range 1 nm to 3 nm. The layer of aluminum oxide can be obtained by depositing a layer of metallic aluminum having the required thickness, followed by an oxidation step, e.g. using a plasma comprising oxygen. The MgO layer can be obtained directly by evaporating a supply of magnesium oxide, e.g. by means of an electron beam, or by cathode sputtering, likewise using a magnesium oxide target.

In the embodiment shown in FIGS. 6 and 7, the material constituting the insert 133, 134 is advantageously selected, for example, for an alumina intermediate layer 130 from metals or semiconductors such as aluminum, gold, silver, silicon, and germanium. In the special circumstance of using aluminum, a particular fabrication technique consists in deposition of a first layer of aluminum, followed by oxidation, so as to constitute the bottom portion of the intermediate layer, followed by deposition of a second layer of aluminum with oxidation in part only in order to constitute the top portion 131 of the intermediate layer 130 and the insert 133, 134 which is then constituted by the non-oxidized fraction of the second layer of aluminum. In the general circumstance of a material other than aluminum, the intermediate layer 130 including the insert 133, 134 is made merely by deposing a first layer 132 of barrier-forming material, depositing the insert 133, 134, and then depositing the second layer of barrier-forming material.

When the intermediate layer 130 is made of magnesium oxide, the material constituting the insert 133, 134 may advantageously be selected, for example, from semiconductor metals such as chromium, ruthenium, tantalum, gold or silver, silicon, and germanium.

In a particular embodiment, the two layers 131, 132 on either side of the insert 133, 134 can be made of different materials so as to optimize the properties of the intermediate layer 130 by selecting materials that present barriers of different heights, thereby giving a second degree of control over the conduction asymmetry of the intermediate layer in addition to or instead of selecting the thicknesses $e_1$ and $e_2$ of the two layers 131, 132 on either side of the layer 133, 134 when making up the intermediate layer 130.

In the embodiment shown in FIGS. 10 and 11, the doped region 135, 136 within the intermediate layer 130 of low conductivity is advantageously made by codeposition of the material(s) constituting said intermediate layer 130 (as a majority fraction) together with the doping element (as a smaller fraction). By way of example, the materials constituting the low-conductivity intermediate layer 130 may be aluminum or magnesium oxide, and the doping elements may be metals or semiconductors such as aluminum, gold, silver, chromium, ruthenium, tantalum, or silicon. The thickness of the low-conductivity intermediate layer 130 can advantageously lie in the range 2 nm to 3 nm, having a doped region of thickness that lies advantageously in the range 0.5 nm to 1 nm.

In the embodiment shown in FIG. 12, the low-conductivity intermediate layer 130 can be made by stacking two layers 131, 137 of insulating or poorly conductive materials (insulation 1, insulation 2), with possibly different thicknesses $e_1$, $e_2$ so as to create a potential profile that is asymmetrical across the thickness of the low-conductivity intermediate layer 130. By way of example, the material used to form the two layers 131, 137 may be selected from magnesium oxide, silica, alumina, and titanium oxide.

In the context of the invention, the writing and reading of information can rely on processes that are well established and known to the person skilled in the art. The bit line 106 and the word line 108 (see FIG. 13) are advantageously made of copper, for example.

Figure 13:
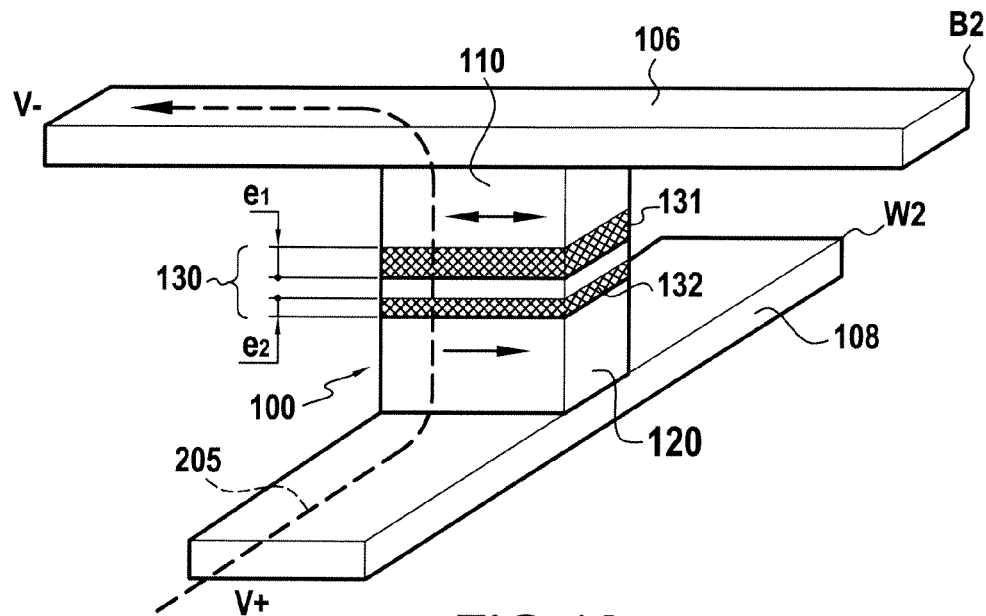
FIG. 13 is a diagram showing the read function of a tunnel junction memory cell of the invention.

Reading can be performed, for example, by determining the level of the electrical resistivity of the magnetic tunnel junction 130 which is comparatively high with antiparallel magnetizations of the reference layer 120 and the storage layer 110, and comparatively low with parallel magnetizations of the reference layer 120 and of the storage layer 110. For this purpose, a potential difference is applied between the word line 108 and the bit line 106 addressing the selected junction 130, and the current symbolized by a dashed line 205 in FIG. 13 is measured.

For planar magnetization of the storage layer 110, writing can be performed, for example, by combining magnetic fields created by simultaneous injection of current pulses into the word line 108 and the bit line 106 that address the memory cell 100 in question.

The vector sum of the two magnetic fields as created in this way is selected to be greater than the coercitive field of the storage layer 110, whereas each of the two magnetic fields considered in isolation is less than the coercitive field of the storage layer 110.

With a storage layer 110 having perpendicular magnetization, writing can be performed, for example, by simultaneously applying current pulses in all or some of the words lines 108 and the bit lines 106 that are adjacent to the memory cell 100 in question. The vector sum of the two to four magnetic fields as created in this way is selected to be greater than the coercitive field of the storage layer 110, whereas each of the magnetic fields considered in isolation is less than the coercitive field of the storage layer 110. Nevertheless, it should be observed that when more than two lines are used for creating the desired magnetic field, combining two of the magnetic fields as created must also produce a sum that is less than the coercitive field of the storage layer 110.

Additional advantages of the invention can be obtained in combination with write processes such as thermally-assisted writing or writing by polarized current injection. The invention presents intrinsic advantages that make implementing either of those two processes easier.

As mentioned above, patent document US 2005/002228 A1 describes in the context of MRAM, a thermally-assisted write process (TAS) in which the free magnetic layer of the addressed tunnel junction is advantageously heated by an electric current injected through the tunnel junction so as to decrease its coercitive field.

Memory cells of the present invention can advantageously be implemented with such a TAS process.

Figure 14:
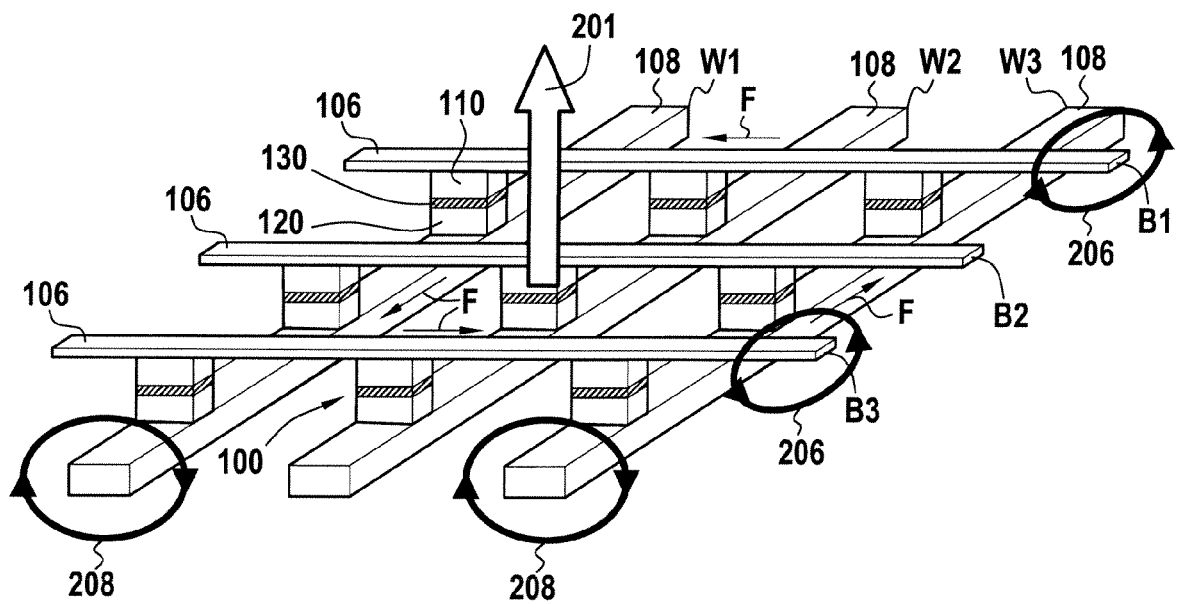
FIGS. 14 to 16 are diagrams showing the write function of a tunnel junction memory cell of the invention, in three possible variant embodiments, for the particular circumstance of a memory cell implementing a thermally-assisted write process.
Figure 15:
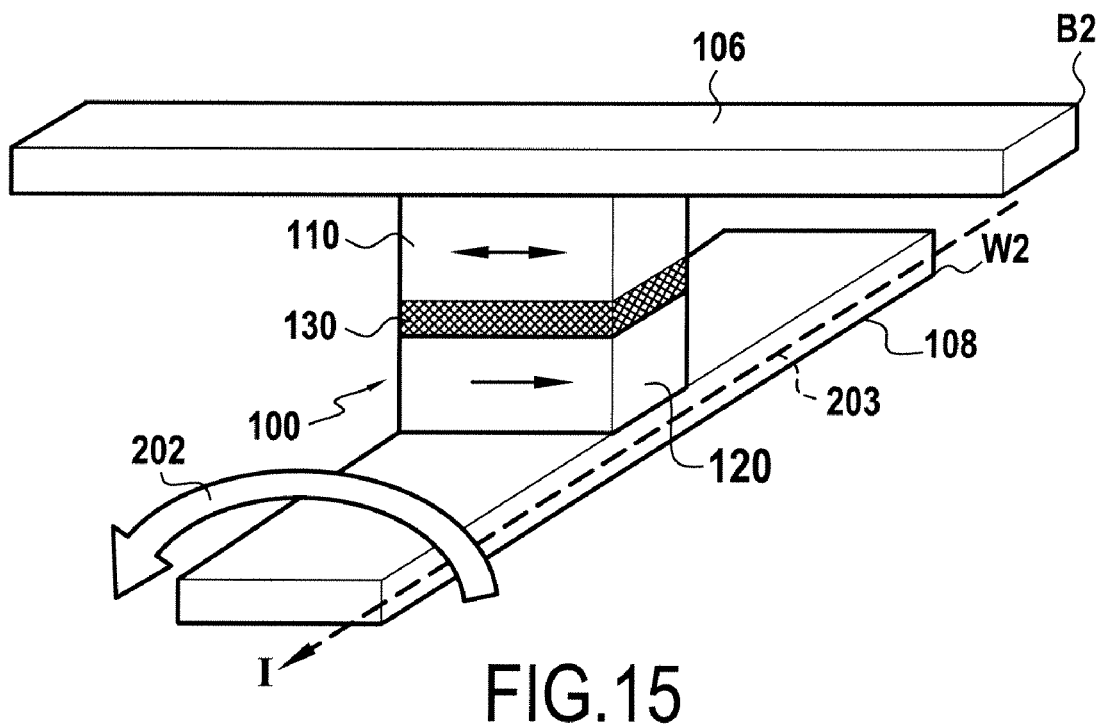
Figure 16:
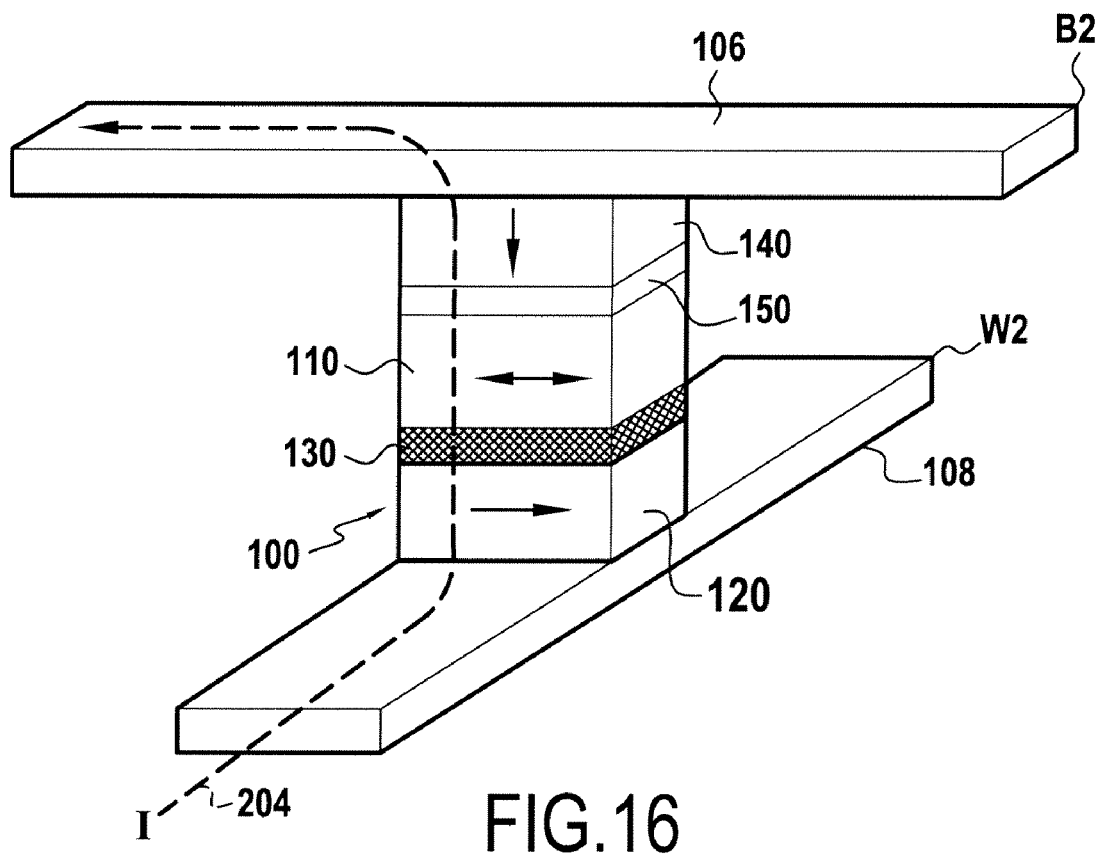

FIGS. 14 to 16 show examples of memory cells 100 of the invention associated with bit lines 106 and word lines 108, with which a thermally-assisted write process is implemented (FIGS. 14 and 15) or with which a write process by injecting a spin-polarized current towards the storage layer (FIG. 16) is implemented.

Briefly, to write a memory point, the memory cell 100, or at least the storage layer 110, is heated to above the blocking temperature of the storage layer but below the blocking temperature of the reference layer 120 by sending a pulse through the memory cell 100. The purpose of this step is to facilitate the write operation proper which is then performed either by applying a magnetic field by passing current along suitably located lines (depending on whether the magnetizations are perpendicular to (FIG. 14) or parallel with (FIG. 15) the planes of the layers), or by injecting current (FIG. 16) using the method described in patent document US 2002/0105823 A1. The blocking temperatures correspond to the temperatures to be reached in order to enable magnetization to be reversed under the applied magnetic field in question.

Nevertheless, in prior art devices, in order to guarantee that the memory cell 100 in which it is desired to modify the relative orientation of the magnetic layer has indeed been selected, such an operation makes it necessary, for example, to use one transistor (based on semiconductor technology) per memory cell or per group of junctions. In that configuration, each write to a memory cell requires its associated transistor to be switched into the ON state by applying a voltage, thereby consuming energy, while the other transistors associated with the other memory cells remain in an OFF state.

The invention makes it possible to omit this transistor by means of the diode effect that is intrinsic to the junction itself: since current can flow only from the reference layer 120 towards the storage layer 110 (since electrons can flow only from the storage layer 110 towards the reference layer 120), the problem of interfering parallel paths via adjacent cells (electrical path in reading and writing and also thermal paths in writing when using the TAS process), and well known to the person skilled in the art, is completely eliminated. In addition to providing increased selectivity, this also provides substantial savings in terms of the current density used, since losses are greatly reduced.

FIG. 14 relates to memory cells 100 having perpendicular magnetization. In FIG. 14, arrows F represent the current flow direction in the bit lines 106 and in the word lines 108. By way of simplified example, FIG. 14 shows three bit lines 106 referred to as line B1, line B2, line B3, and three word lines 108, referred to as line W1, line W2, line W3. The loops 206, 208 with arrows represent the directions of the magnetic fields created by current flowing in the bit lines 106 and the word lines 108, respectively. Arrow 201 represents the resulting magnetic field in the cell that is addressed.

The write operation can be performed by applying a local magnetic field to the storage layer. By way of example, if the cell 100 that is to be addressed is situated at the intersection between the line B2 and the line W2, the two conductor lines B1 and B3 situated on either side of the junction that is to be addressed are fed with currents in the opposite direction to create two magnetic fields perpendicular to the plane of the array of cells. The same operation can be performed on the conductor lines W1 and W3 so that the four magnetic fields are all directed in the same direction at the storage layer and are directed perpendicularly thereto.

In FIG. 15, arrows F represent the directions in which currents are applied in the conductor lines B1, B3, W1, and W3 in order to apply a magnetic field 201 that is perpendicular and directed "upwards" (where passing current in the opposite direction would lead to a magnetic field being created that is directed "downwards"). Each field taken separately is less than the reversal field of the storage layer, thus preventing untimely reversal of the adjacent magnetic tunnel junctions. In addition, since each individual field is only one-fourth of the total field, the current "i" in each line needed for creating it is divided by four relative to the current "I" that would be necessary if only one line were used. In terms of power consumption:

$$P_{total} = 4*Ri^2 = 4*R(I/4)^2 = RI^2/4$$

the saving is thus by a factor of 4 (R representing the electrical resistance of a conductor line).

For memory cells with planar magnetization, the write operation can be performed as shown in FIG. 15, by applying a local magnetic field represented by an arrow 202 at the storage layer. The memory cells in FIG. 15 can be arranged in the geometrical plane in the same manner as the memory cells of FIG. 14.

Nevertheless, for simplification purposes, FIG. 15 shows only one cell 100 placed at the intersection between a bit line B2 and a word line W2. Given that the magnetization for reversing lies in the plane of the layers, the current for creating a local magnetic field passes along the lines B2 or W2. In FIG. 15, the current 2 traveling along the line W2 is represented by a dashed line 203.

FIG. 16, still in the context of memory cells with planar magnetization, shows another example of the write operation.

In FIG. 16, the write operation is performed by injecting current that leads to movement in precession of the magnetization of the storage layer. To use this method as described in patent document US 2002/0105823 A1, it is necessary to insert a magnetic device 140 acting as an electron polarizer having magnetization perpendicular to that of the storage layer 110. The direction of magnetization of this polarizer 140 may either be perpendicular to the plane of the thin layer constituted by said polarizer, or else planar, in which case it has a direction of magnetization that is perpendicular to the magnetization of the storage layer (or that presents an angle that is close to perpendicular). The polarizer 140 is placed between the top copper line and the storage layer, as described in patent document US 2002/0105823 A1. In addition, it is necessary to insert a separator layer 150 between the polarizer 140 and the storage layer 100. This separator layer 150 may be constituted either by a non-magnetic metal (or a plurality of metals), or else by an insulating layer. The current I passes through the memory cell from the line W2 towards the line B2 (dashed line 204) corresponding to electrons being injected from the perpendicular polarizer 140 towards the storage layer 110. This configuration is thus indeed compatible with the memory cells of the present invention.

Naturally, it is also possible to combine the embodiments of FIGS. 15 and 16.

With reference to FIGS. 17 to 20 there follows a description of applications of magnetic devices 100 of the invention to two-dimensional or three-dimensional memories which, because of the invention, present improved memory cell densities per unit area.

Figure 17:
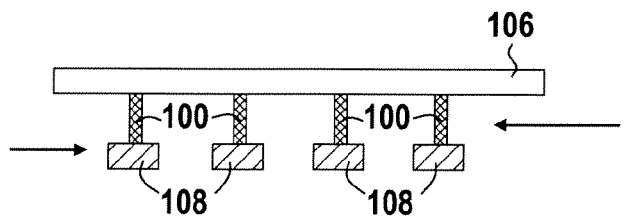
FIGS. 17 and 18 are diagrammatic section and perspective views of a two-dimensional memory implementing the invention.

FIG. 17 is a section view of a two-dimensional architecture for a memory that comprises N*N memory elements 100 made in accordance with the invention, where N is an integer.

A bit line 106 thus serves N memory elements 100. Each word line 108 also provides a connection to N memory elements 100.

Figure 18:
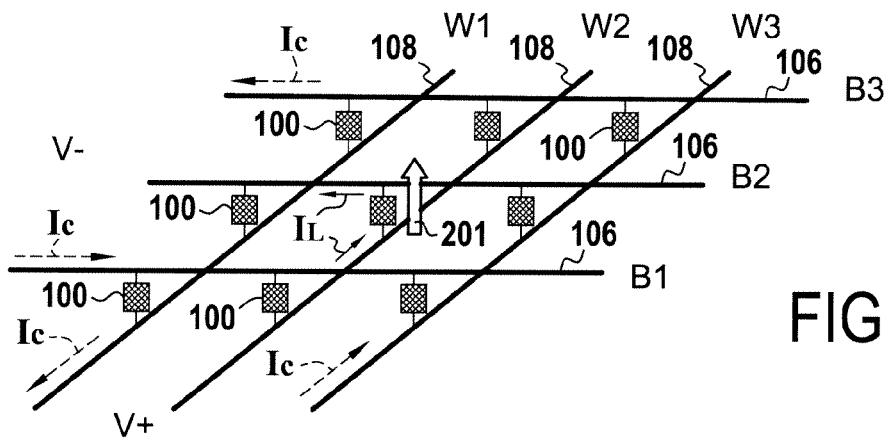

FIG. 18 is a diagrammatic perspective view showing such a two-dimensional architecture, and by way of illustration and in simplified form, the number N is reduced to three for the bit lines B1, B2, B3 and for the words lines W1, W2, W3.

To read the information recorded on a memory element, a potential difference is applied between a bit line and a word line that intersects at the memory element for reading.

Thus, in the example of FIG. 18, a potential difference is applied between the lines B2 and W2 and the read current $I_r$ is read to determine the value of the stored information ("0" or "1").

Reading information at a memory point depends on the relative orientations of the magnetizations in the ferromagnetic layers used as the reference layer and as the storage layer.

With planar magnetization, it is possible to use the conventional method that is well known to the person skilled in the art and that is described above with reference to FIGS. 2 to 5.

With perpendicular magnetization, use is made of a combination of current pulses IC traveling along the word lines and the bit lines that are adjacent to those connected to the memory cell in question (lines B1, B3, W1, and W3 in FIG. 18). The field 201 created by the current pulse in each of the lines is less than the coercive field of the storage layer. However, the sum of all four fields is greater. The use of four lines makes it possible to avoid involuntary writing of information in any other memory cell.

The present invention is compatible with conventional methods of reading information from MRAMs. Since the asymmetrical electrical conduction is associated with the tunnel barrier within the memory cell, the invention makes it possible to omit implementing a transistor or other elements for guaranteeing the desired selectivity in writing and reading that would otherwise need to be connected in series with the memory cell (or with a group of memory cells). The invention thus makes it possible to use conventional methods in advantageous manner and to obtain higher storage densities.

As mentioned above, this organization of the memory and implementation of the invention are also compatible with writing that is thermally assisted or writing by injecting spin-polarized current into the storage layer. The invention enables these methods to be implemented in advantageous manner while enabling greater storage densities to be achieved.

Figure 19:
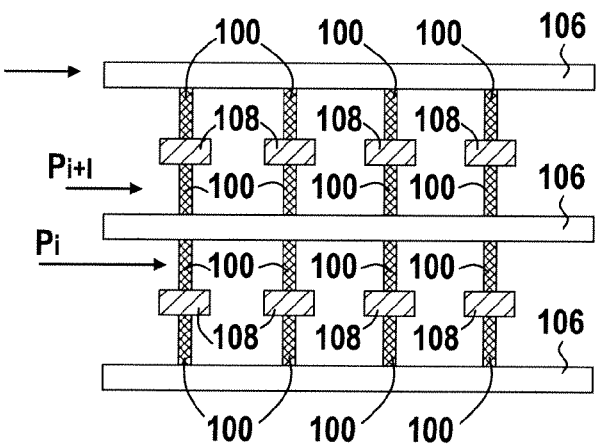
FIGS. 19 and 20 are diagrammatic section views of two examples of three-dimensional memories implementing the invention.

FIG. 19 shows an example of an application of the invention to three-dimensional architecture, in which the word lines 108 and the bit lines 106 are used by two memory layers, thereby saving space and facilitating integration.

Thus, the three-dimensional architecture of FIG. 19 comprises a set of P superposed layers each having N*N memory cells 100 each connected to one bit line 106 and one word line 108, where P and N are integers.

Each bit line 106 and each word line 108 serving memory cells 100 other than the memory cells of the outer layers is associated with memory cells 100 belonging to two different adjacent layers $P_i$ and $P_{i+1}$.

Figure 20:
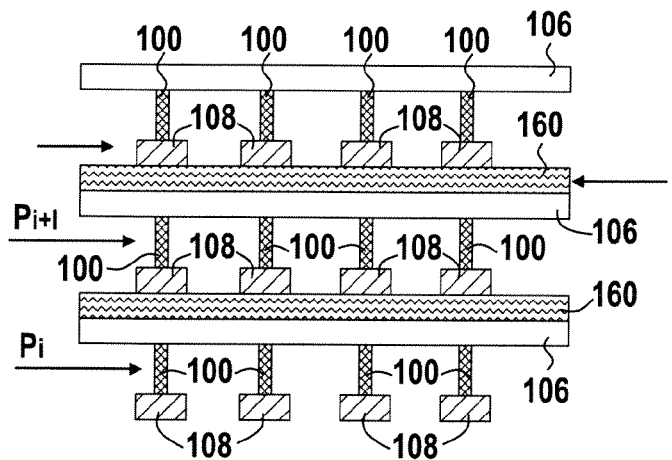

FIG. 20 shows a three-dimensional architecture that is obtained by stacking two-dimensional architectures and inserting insulating separator layers 160. Under such circumstances, the word lines and/or the bit lines are no longer common between the different planes of memory cells in the three-dimensional memory.

More particularly, the three-dimensional architecture of FIG. 20 comprises a stack of P superposed layers each having N*N memory cells 100, with the memory cells 100 in each layer $P_i$, $P_{i+1}$ being distributed in a two-dimensional configuration, P and N being integers. Each bit line 106 serves N memory cells 100 and each word line 108 serves N memory cells 100 within one of the two-dimensional layers. An insulating separator layer 160 is interposed between two successive two-dimensional layers $P_i$, $P_{i+1}$ in periodic manner in the stack of P superposed layers.

This technique enables fabrication technology to be simplified without loss of density, and makes it possible to perform replanarization prior to growing memory layer (n+1) after making memory layer (n) and the insulating separator layer. In a variant of the invention, the insulating separator layers can be inserted periodically in the structure, but not after each memory layer (e.g. once every j planes, where j is an integer). This variant of the invention seeks to correct growth defects that can occur when successively stacking more than j memory layers, or to subdivide the memory into elements each comprising j planes, e.g. in order to facilitate making lateral electrical connections to the memory layers.

Depending on the orientation of the magnetization in the storage layers, use is made of the method described above for writing information in a two-dimensional architecture. This organization of the memory is also compatible with TAS (thermally-assisted) writing and with current-induced magnetic switching (CIMS), i.e. writing by injecting a spin-polarized current.

The invention claimed is:

1. A magnetic device comprising a magnetoresistive tunnel junction, including:
   a reference magnetic layer having magnetization in a direction that is fixed;

a storage magnetic layer having magnetization in a direction that is variable; and an intermediate layer acting as a tunnel barrier that is essentially semiconductor or electrically insulating and that separates the reference magnetic layer from the storage magnetic layer;

the device being characterized in that the potential profile of the intermediate layer is asymmetrical across a thickness of said intermediate layer this asymmetry being caused by the creation of a potential well that is localized in an asymmetrical position within the thickness of the tunnel barrier, this asymmetry producing a current response that is asymmetrical as a function of the applied voltage, and in that the potential well that is localized in an asymmetrical position within the thickness of the tunnel barrier is created through either a first creating means or a second creating means, wherein according to the first creating means, the intermediate layer acting as a tunnel barrier includes in its thickness, at a first distance ($e_1$) from the storage magnetic layer and at a second ($e_2$) distance from the reference magnetic layer, a very thin layer of a metallic or semiconductive material other than that or those constituting the remainder of the intermediate layer, the second distance ($e_2$) presenting value that is different from that of the first distance ($e_1$), said very thin layer presenting a thickness either of one to two planes of atoms or of a fraction of a plane of atoms, and according to the second creating means, said intermediate layer acting as a tunnel barrier includes a doped region within its thickness at a first distance ($e_1$) from the storage magnetic layer and at a second distance ($e_2$) from the reference magnetic layer, where the second distance presents a value different from that of the first distance ($e_1$), the doped region being doped by inserting a material other than that constituting the remainder of the intermediate layer so as to create in the doped region said potential well.

2. A device according to claim 1, characterized in that in said first creating means the remainder of the intermediate layer comprises different insulating or semiconductive materials on either side of the very thin layer.

3. A device according to claim 1, characterized in that in said second creating means one of the first and second distances ($e_1$, $e_2$) is zero such that the doped region is in contact with one of the two outer interfaces of said intermediate layer with the reference magnetic layer and with the storage magnetic layer.

4. A device according to claim 1, characterized in that said intermediate layer comprises alumina.

5. A device according to claim 4, characterized in that said very thin layer of said first creating means is made of a material selected from aluminum, gold, silver, silicon, and germanium.

6. A device according to claim 1, characterized in that said intermediate layer comprises magnesium oxide.

7. A device according to claim 6, characterized in that said very thin layer of said first creating means is made of a material selected from chromium, ruthenium, tantalum, gold, silver, silicon, and germanium.

8. A device according to claim 1, characterized in that the intermediate layer acting as a tunnel barrier presents a thickness lying in the range 1 nm to 3 nm.

9. A device according to claim 1, characterized in that in said second creating means the intermediate layer acting as a tunnel barrier presents thickness lying in the range 2 nm to 3 nm, and in that the doped region presents thickness lying in the range 0.5 nm to 1 nm.

10. A device according to claim 1 characterized in that in said second creating means the intermediate layer is made of alumina or of magnesium oxide, and in that the doped region comprises metallic or semiconductor doping elements comprising at least one of the materials constituted by aluminum, gold, silver, chromium, ruthenium, tantalum, and silicon.

11. A memory comprising an array of memory cells addressable by a set of bit lines and of word lines, said memory being characterized in that each memory cell comprises a magnetic device according to claim 1, and in that each magnetic device is connected to one bit line and to one word line without interposing any additional switch element.

12. A memory according to claim 11, characterized in that it comprises N*N memory cells distributed in a two-dimensional architecture, where N is an integer, each bit line serving N memory cells, and each word line serving N memory cells.

13. A memory comprising an array of memory cells addressable by a set of bit lines and of word lines, said memory being characterized in that each memory cell comprises a magnetic device comprising magneto resistive tunnel junction including a reference magnetic layer having magnetization a direction that is fixed;

a storage magnetic layer having magnetization in a direction that is variable, and;

an intermediate layer acting as a tunnel barrier that is essentially semiconductor or electronically insulating and that separates the reference magnetic layer from the storage magnetic layer;

the device being characterized in that the potential profile of the intermediate layer is asymmetrical across a thickness of said intermediate layer so as to produce a current response that is asymmetrical as a function of the applied voltage, said memory being characterized in that each magnetic device is connected to one bit line and to one word line without interposing any additional switch element, and in that said memory presents three-dimensional architecture comprising a set of P superposed layers, each of N*N memory cells, each connected to one bit line and to one word line, where P and N are integers, and in that each bit line and each word line serving memory cells other than the memory cells of the outer layers is associated with memory cells belonging to two different adjacent layers ($P_i$, $P_{i+1}$).

14. A memory comprising an array of memory cells addressable by a set of bit lines and of word lines, said memory being characterized in that each memory cell comprises a magnetic device comprising a magneto resistive tunnel junction including a reference magnetic layer having magnetization in a direction that is fixed;

a storage magnetic layer having magnetization in a direction that is variable, and;

an intermediate layer acting as a tunnel barrier that is essentially semiconductor or electronically insulating and that separates the reference magnetic layer from the storage magnetic layer;

the device being characterized in that the potential profile of the intermediate layer is asymmetrical across a thickness of said intermediate layer so as to produce a current response that is asymmetrical as a function of the applied voltage said memory being characterized in that each magnetic device is connected to one bit line and to one word line without interposing any additional switch element, and in that said memory presents three-dimensional architecture comprising a stack of P superposed layers of N*N memory cells, memory cells of each layer ($P_i$, $P_{i+1}$) being distributed in a two-dimensional architecture, P and N being integers, each bit line serving N memory cells and each word line serving N memory cells within one two-dimensional architecture layer, and in that an insulating separator layer is interposed between two successive two-dimensional architecture layers ($P_i$, $P_{i+1}$) in periodic manner in the stack of P superposed layers.

15. A device according to claim 1, characterized in that
said intermediate layer comprises magnesium oxide;
said very thin layer is made of a material selected from chromium, ruthenium, tantalum, gold, silver, silicon, and germanium; and
the intermediate layer acting as a tunnel barrier presents a thickness lying in the range 1 nm to 3 nm.

16. A memory comprising an array of memory cells addressable by a set of bit lines and of word lines, said memory being characterized in that each memory cell comprises a magnetic device comprising a magnetoresistive tunnel junction including
a reference magnetic layer having magnetization in direction is fixed;
a storage magnetic layer having magnetization in a direction that is variable; and
an intermediate layer acting as a tunnel barrier that is essentially semiconductor or electrically insulating and that separates the reference magnetic layer from the storage magnetic layer;
the device being characterized in that the potential profile of the intermediate layer is asymmetrical across a thickness of said intermediate layer so as to produce a current response that is asymmetrical as a function of the applied voltage, said magnetic device being further characterized in that said intermediate layer acting as a tunnel barrier includes a doped region within its thickness at a first distance ($e_1$) from the reference magnetic layer, where the second distance presents a value different from of that of the first distance ($d_1$), the doped region being doped by inserting a material other than that constituting the remainder of the intermediate layer so as to create in the doped region a potential well that is localized and asymmetrical within the tunnel barrier, and said memory being characterized in that each magnetic device is connected to one bit line and to one word line without interposing any additional switch element;
the memory characterized in that
it comprises N*N memory cells distributed in a two-dimensional architecture, where N is an integer, each bit line serving N memory cells, and each word line serving N memory cells;
it presents three-dimensional architecture comprising a set of P superposed layers, each of N*N memory cells, each connected to one bit line and to one word line, where P and N are integers, and in that each bit line and each word line serving memory cells other than the memory cells of the outer layers is associated with memory cells belonging to two different adjacent layers ($P_i$, $P_{i+1}$); and
it presents three-dimensional architecture comprising a stack of P superposed layers of N*N memory cells, memory cells of each layer ($P_i$, $P_{i+1}$) being distributed in a two-dimensional architecture, P and N being integers, each bit line serving N memory cells and each word line serving N memory cells within one two-dimensional architecture layer, and in that an insulating separator layer is interposed between two successive two-dimensional architecture layers ($P_i$, $P_{i+1}$) in periodic manner in the stack of P superposed layers.

17. A memory comprising an array of memory cells addressable by a set of bit lines and of word lines, said memory being characterized in that each memory cell comprises a magnetic device comprising a magnetoresistive tunnel junction including:
a reference magnetic layer having magnetization in a direction that is fixed;
storage magnetic layer having magnetization in direction that is variable; and
an intermediate layer acting as a tunnel barrier that is essentially semiconductor or electrically insulating and that separates the reference magnetic layer from the storage magnetic layer;
the device being characterized in that the potential profile of the intermediate layer is asymmetrical across a thickness of said intermediate layer so as to produce a current response that is asymmetrical as a function of the applied voltage, said magnetic device being further characterized in that in said second creating means one of the first and second distances ($e_1$, $e_2$) is zero such that the doped region is in contact with one of the two outer interfaces of said intermediate layer with the reference magnetic layer and with the storage magnetic layer, and said memory being characterized in that each magnetic device is connected to one bit line and to one word line without interposing any additional switch element;
the memory characterized in that
it comprises N*N memory cells distributed in a two-dimensional architecture, where N is an integer, each bit line serving N memory cells, and each word line serving N memory cells;
it presents three-dimensional architecture comprising a set of P superposed layers, each of N*N memory cells, each connected to one bit line and to one word line, where P and N are integers, and in that each bit line and each word line serving memory cells other than the memory cells of the outer layers is associated with memory cells belonging to two different adjacent layers ($P_i$, $P_{i+1}$); and
it presents three-dimensional architecture comprising a stack of P superposed layers of N*N memory cells, memory cells of each layer ($P_i$, $P_{i+1}$) being distributed in a two-dimensional architecture, P and N being integers, each bit line serving N memory cells and each word line serving N memory cells within one two-dimensional architecture layer, and in that an insulating separator layer is interposed between two successive two-dimensional architecture layers ($P_i$, $P_{i+1}$) in periodic manner in the stack of P superposed layers.

18. A magnetic device comprising a magnetoresistive tunnel junction, including:
a reference magnetic layer;
a storage magnetic layer having magnetization in a direction that is variable; and
an intermediate layer acting as a tunnel barrier that is essentially semiconductor or electrically insulating and that separates the reference magnetic layer from the storage magnetic layer;
the device being characterized in that the potential profile of the intermediate layer is asymmetrical across a thickness of said intermediate layer this asymmetry being caused by the creation of a potential well that is localized in an asymmetrical position within the thickness of the tunnel barrier, this asymmetry producing a current response that is asymmetrical as a function of the applied voltage, and in that the potential well that is localized in an asymmetrical position within the thickness of the tunnel barrier is created through either a first creating means or a second creating means, wherein according to the first creating means, the intermediate layer acting as a tunnel barrier includes in its thickness, at a first distance ($e_1$) from the storage magnetic layer and at a second distance ($e_2$) from the reference magnetic layer, a very thin layer of a metallic or semiconductive material other than that or those constituting the remainder of the intermediate layer, the second distance ($e_2$) presenting a value that is different from that of the first distance ($e_1$), said very thin layer presenting a thickness either of one to two planes of atoms or of a fraction of a plane of atoms, and according to the second creating means, said intermediate layer acting as a tunnel barrier includes a doped region within its thickness at a first distance ($e_1$) from the storage magnetic layer and at a second distance ($e_2$) from the reference magnetic layer, where the second distance presents a value different from that of the first distance ($e_1$), the doped region being doped by inserting a material other than that constituting the remainder of the intermediate layer so as to create in the doped region said potential well.

19. A memory comprising an array of memory cells addressable by a set of bit lines and of word lines, said memory being characterized in that each memory cell comprises a magnetic device comprising a magneto resistive tunnel junction including
    a reference magnetic layer;
    a storage magnetic layer having magnetization in a direction that is variable, and;
    an intermediate layer acting as a tunnel barrier that is essentially semiconductor or electronically insulating and that separates the reference magnetic layer from the storage magnetic layer;
the device being characterized in that the potential profile of the intermediate layer is asymmetrical across a thickness of said intermediate layer so as to produce a current response that is asymmetrical as a function of the applied voltage, said memory being characterized in that each magnetic device is connected to one bit line and to one word line without interposing any additional switch element, and in that said memory presents three-dimensional architecture comprising a set of P superposed layers, each of N*N memory cells, each connected to one bit line and to one word line, where P and N are integers, and in that each bit line and each word line serving memory cells other than the memory cells of the outer layers is associated with memory cells belonging to two different adjacent layers ($P_i$, $P_{i+1}$).

20. A memory comprising an array of memory cells addressable by a set of bit lines and of word lines, said memory being characterized in that each memory cell comprises a magnetic device comprising a magneto resistive tunnel junction including
    a reference magnetic layer;
    a storage magnetic layer having magnetization in a direction that is variable, and;
    an intermediate layer acting as a tunnel barrier that is essentially semiconductor or electronically insulating and that separates the reference magnetic layer from the storage magnetic layer;
    the device being characterized in that the potential profile of the intermediate layer is asymmetrical across a thickness of said intermediate layer so as to produce a current response that is asymmetrical as a function of the applied voltage, and in that each magnetic device is connected to one bit line and to one word line without interposing any additional switch element, and in that said memory presents three-dimensional architecture comprising a stack of P superposed layers of N*N memory cells, memory cells of each layer ($P_i$, $P_{i+1}$) being distributed in a two-dimensional architecture, P and N being integers, each bit line serving N memory cells and each word line serving N memory cells within one two-dimensional architecture layer, and in that an insulating separator layer is interposed between two successive two-dimensional architecture layers ($P_i$, $P_{i+1}$) in periodic manner in the stack of P superposed layers.

21. A memory comprising an array of memory cells addressable by a set of bit lines and of word lines, said memory being characterized in that each memory cell comprise a magnetic device comprising a magnetoresistive tunnel junction including
    a reference magnetic layer;
    a storage magnetic layer having magnetization in a direction that is variable; and
    an intermediate layer acting as a tunnel barrier that is essentially semiconductor or electrically insulating and that separates the reference magnetic layer from the storage magnetic layer;
    the device being characterized in that the potential profile of the intermediate layer is asymmetrical across a thickness of said intermediate layer so as to produce a current response that is asymmetrical as a function of the applied voltage, said magnetic device being further characterized in that said intermediate layer acting as a tunnel barrier includes a doped region within its thickness at a first distance ($e_1$) from the reference magnetic layer, where the second distance presents a value different from that of the first distance ($d_1$), the doped region being doped by inserting a material other than that constituting the remainder of the intermediate layer so as to create in the doped region a potential well that is localized and asymmetrical within the tunnel barrier, and said memory being characterized in that each magnetic device is connected to one bit line and to one word line without interposing and additional switch element;
    the memory characterized in that
    it comprises N*N memory cells distributed in a two-dimensional architecture, where N is an integer, each bit line serving N memory cells, and each word line serving N memory cells;
    it presents three-dimensional architecture comprising a set of P superposed layers, each of N*N memory cells, each connected to one bit line and to one word line, where P and N are integers, and in that each bit line and each word line serving memory cells other that the memory cells of the outer layers is associated with memory cells belonging to two different adjacent layers ($P_i$, $P_{i+1}$); and
    it presents three-dimensional architecture comprising a stack of P superposed layers of N*N memory cells, memory cells of each layers ($P_i$, $P_{i+1}$) being distributed in a two-dimensional architecture, P and N being integers, each bit line serving N one two-dimensional architecture layer, and in that an insulating separator layer is interposed between two successive two-dimensional architecture layers ($P_i$, $P_{i+1}$) in periodic manner in the stack of P superposed layers.

22. A memory comprising an array of memory cells addressable by a set of bit lines and of word lines, said memory being characterized in that each memory cells comprises a magnetic device comprising a magnetoresistive tunnel junction including:

a reference magnetic layer;

a storage magnetic layer having magnetization in a direction that is variable; and an intermediate layer acting as a tunnel barrier that is essentially semiconductor or electrically insulating and that separates the reference magnetic layer from the storage magnetic layer;

the device being characterized in that the potential profile of the intermediate layer is asymmetrical across a thickness of said intermediate layer so as to produce a current response that is asymmetrical as a function of the applied voltage, said magnetic device being further characterized in that in said second creating means one of the first and second distances ($e_1$, $e_2$) is zero such that the doped region is in contact with one of the two outer interfaces of said intermediate layer with the reference magnetic layer and with the storage magnetic layer, and said memory being characterized in that each magnetic device is connected to one bit line and to one word line without interposing any additional switch element;

the memory characterized in that it comprises N*N memory cells distributed in a two-dimensional architecture, where N is an integer, each bit line serving N memory cells, and each word line serving N memory cells;

it presents three-dimensional architecture comprising a set of P superposed layers, each of N*N memory cells, each connected to one bit line and to one word line, where P and N are integers, and in that each bit line and each word line serving memory cells other than the memory cells of the outer layers is associated with memory cells belonging to two different adjacent layers ($P_i$, $P_{i+1}$): and it presents three-dimensional architecture comprising a stack of P superposed layers of N*N memory cells, memory cells of each layer ($P_i$, $P_{i+1}$) being distributed in a two-dimensional architecture, P and N being integers, each bit line serving N memory cells and each word line serving N memory cells within one two-dimensional architecture layer, and in that an insulating separator layers is interposed between two successive two-dimensional architecture layers ($P_i$, $P_{i+1}$) in periodic manner in the stack of P superposed layers.

23. A device according to claim 1 characterized in that in said second creating means the intermediate layer is made of alumina or of magnesium oxide, and in that the doped region comprises metallic or semiconductor doping elements comprising at least one of the materials constituted by aluminum, gold, silver, chromium, ruthenium, tantalum, and silicon.

24. A device according to claim 9 characterized in that in said second creating means the intermediate layer is made of alumina or of magnesium oxide, and in that the doped region comprises metallic or semiconductor doping elements comprising at least one of the materials constituted by aluminum, gold, silver, chromium, ruthenium, tantalum, and silicon.

* * * * *

UNITED STATES PATENT AND TRADEMARK OFFICE
CERTIFICATE OF CORRECTION

PATENT NO.      : 7,821,818 B2                                    Page 1 of 1
APPLICATION NO. : 12/083398
DATED           : October 26, 2010
INVENTOR(S)     : Dieny et al.

It is certified that error appears in the above-identified patent and that said Letters Patent is hereby corrected as shown below:

On the title page, item [73] Assignees, "Comissariat" should read --Commissariat--;

In the Specification

Column 11, line 58, "IC" should read --$I_c$--;

In the Claims

Column 13, claim 1, line 21, "second ($e_2$) distance" should read --second distance ($e_2$)--;

Column 13, claim 1, line 25, "presenting value" should read --presenting a value--;

Column 14, claim 13, line 22, "magnetization a" should read --magnetization in a--;

Column 14, claim 14, line 62, "voltage" should read --voltage,--;

Column 15, claim 16, line 21, "magnetization a" should read --magnetization in a--;

Column 15, claim 16, line 22, "is fixed" should read --that is fixed--;

Column 15, claim 16, line 38, "from of that" should read --from that--;

Column 16, claim 17, line 10, "storagemagnetic" should read --a storage magnetic--; and Column 16, claim 17, line 10, "in direction" should read --in a direction--.

Signed and Sealed this
Nineteenth Day of November, 2013

Teresa Stanek Rea
*Deputy Director of the United States Patent and Trademark Office*